United States Patent [19]

Yamazaki et al.

[11] Patent Number: 5,013,688
[45] Date of Patent: May 7, 1991

[54] METHOD OF MANUFACTURING A SEMICONDUCTOR USING PLASMA PROCESSING

[75] Inventors: Shunepi Yamazaki, Tokyo; Kazuo Urata, Atsugi; Itaru Koyama, Hatano; Noriya Ishida, Atsugi; Mari Sasaki, Atsugi; Shinji Imatou, Atsugi; Kazuhisa Nakashita, Atsugi; Naoki Hirose, Atsugi, all of Japan

[73] Assignee: Semiconductor Energy Laboratory Co., Ltd., Kanagawa, Japan

[21] Appl. No.: 385,155

[22] Filed: Jul. 26, 1989

[30] Foreign Application Priority Data

Aug. 5, 1988 [JP] Japan .................... 63-195685

[51] Int. Cl.5 .................... H01L 21/321; H01L 25/04
[52] U.S. Cl. .................... 437/210; 437/211; 437/937
[58] Field of Search .................... 148/DIG. 17; 136/256; 437/238, 937, 210, 211; 357/52; 252/70; 156/643

[56] References Cited

U.S. PATENT DOCUMENTS 4,579,609  4/1986  Reif et al. .................... 437/937
4,585,537  4/1986  Nakayama et al. .................... 437/238
4,749,587  6/1988  Bergmann et al. .................... 427/248.1
4,758,775  7/1988  Fujisaki et al. .................... 357/52

Primary Examiner—Olik Chaudhuri
Assistant Examiner—David E. Graybill
Attorney, Agent, or Firm—Sixbey, Friedman, Leedom & Ferguson

[57] ABSTRACT

An improved electric device and manufacturing method for the same are described. The device is, for example, an IC chip clothed with moulding. In advance of the moulding process, the IC chip is coated with silicon nitride in order to protect the IC chip from moisture invaded through cracks or gaps. The coating of silicon nitride is carried out after cleaning the surface of the IC chip by plasma CVD.

9 Claims, 4 Drawing Sheets

METHOD OF MANUFACTURING A SEMICONDUCTOR USING PLASMA PROCESSING

BACKGROUND OF THE INVENTION

The present invention relates to an electric device and manufacturing method of the same.

Integrated semiconductor circuits are most important electric devices which have been broadly used in a variety of fields. One of the problems from the viewpoint of reliability is the invasion of moisture or other impurities into the IC chips embedded in moulding. The invasion takes place through cracks or gaps occuring in the moulding to form paths from the outside of the moulding to the surface of the IC chip. The moisture which reaches the IC surface causes undesirable corrosion of the semiconductor constituting the IC chip and leads to malfunction of the chip.

FIG. 1 is an illustration showing how defects are formed in the packaged IC device. The structure comprises an IC semiconductor chip 29 mounted on a base frame 35, leads 37 with which the IC chip 29 is electrically coupled by means of Au wiring 39 and epoxy moulding enclosing the IC chip and lead frames 35 and 37. The surfaces of the frames have usually oxidized and formed suboxide films 24, 24' and 32 on the surface. In this structure, moisture tends to gather near the interface between the frame and the moulding. When the IC device is arranged on an electrical circuit board, soldering is performed by dipping the IC device in a molten solder at 260° C. for 3 to 10 seconds. The rapid change in temperature often causes cracks in the moulding as designated by 33 and 39. Also, the moisture trapped around the frames is evaporated and causes swelling 41' to form a cavity 42 by the vapor pressure resulting in cracks 33'. This swelling is particularly likely since the oxide film 32 weakens the sticking of the moulding to the frame.

SUMMARY OF THE INVENTION

It is therefore an object of the present invention to provide a reliable electric device and manufacturing the same which is immune to moisture or other impurities invading through cracks or other paths of a package enclosing the device.

BRIEF DESCRIPTION OF THE DRAWING

This invention can be better understood from the following detailed description when read in conjunction with the drawing in which;

FIG. 3 (B) is a partial expanded view of the unit structure of the lead frame illustrated in FIG. 3 (A).

FIG. 3 (C) is a partial cross sectional view taken along C—C line of FIG. 3 (B).

DETAILED DESCRIPTION OF THE PREFERRED EMBODIMENTS

Figure 2:
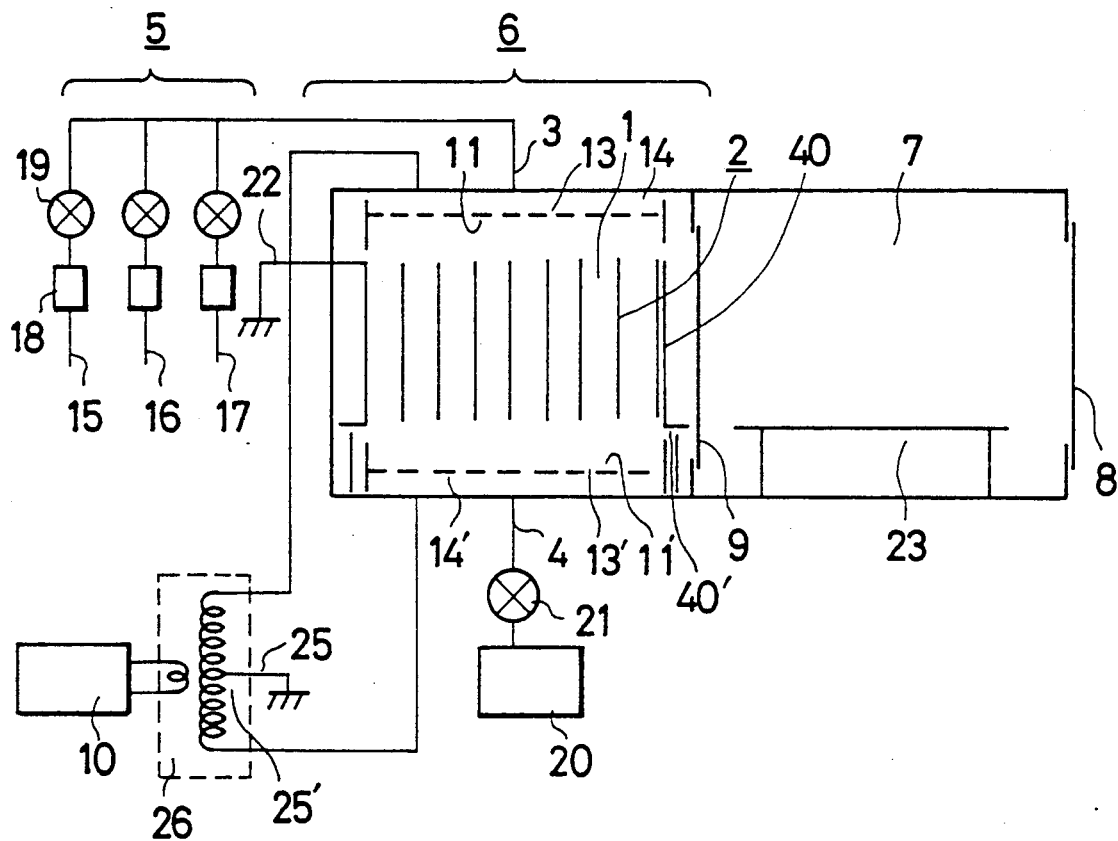
FIG. 2 is a schematic diagram showing a plasma CVD apparatus for use in embodying the present invention.

Referring now to FIGS. 2 and 3(A) to 3(C), a plasma processing method in accordance with an embodiment of the present invention is described. FIG. 2 is a shematic cross sectional diagram showing a plasma CVD apparatus. The apparatus comprises a deposition chamber 1, a loading-unloading chamber 7 coupled to the deposition chamber 1 through a gate valve 9, a pair of mesh or grid electrodes 11 and 14 provided in the deposition chamber 1, a gas feeding system 5, a vacuum pump 20 connected to the chamber 1 through a valve 21, and a high frequency power source 10 for supplying electric energy between the electrode 11 and 14 through a transformer 26. The mid point 25 of the secondary coil of the transfomer 26 is grounded at 25. The gas feeding system includes three sets of flow rate meters 18 and valves 19. The high frequency energy inputted to the electrodes 11 and 14 causes positive column glow discharge therebetween. The glow discharge region (deposition region) is confined by a four-sided frame 40' in order to avoid undesirable deposition outside the region. The frame 40 is supported by a supporter 40 and may be a grounded metal frame or an insulating frame. Within the deposition region, a number of substrate assemblies 2 are supported by the frame 40 and disposed in parallel with intervals of 3 to 13 cm, e.g. 8 cm. A plurality of IC chips are mounted on each assembly 2.

Figure 3A:
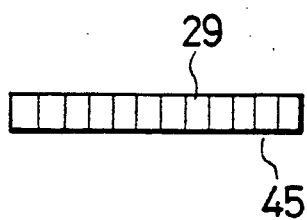
FIG. 3 (A) is a schematic plan view showing the entirety of a lead frame structure for supporting IC devices in accordance with the present invention.
Figure 3B:
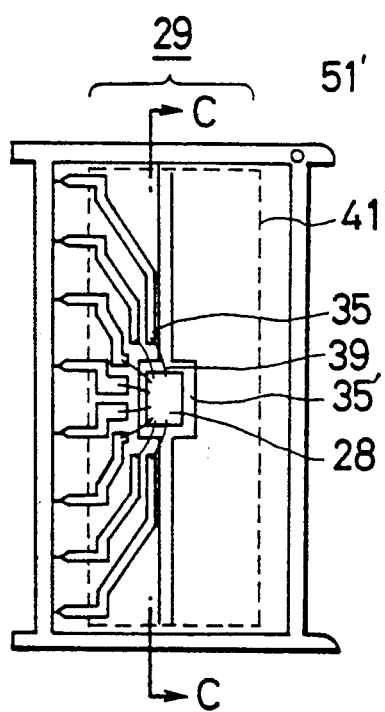
Figure 3C:
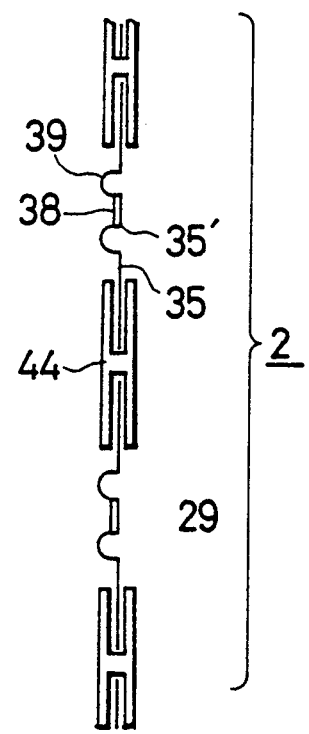

The chip assembly is comprised of holding jigs 44 and lead frames 29 interposed and supported between the adjacent jigs 44 as illustrated in FIGS. 3(B) and 3(C). IC chips have been mounted on appropriate positions (center bases) of the lead frame 29 and electrically connected with the distal ends of the leads arranged therearound by means of Au wiring 39. The surface of the center bases have been formed with rough surfaces in order to expedite the strength of connection between the frames and the moulding which is to be provided in the following process. FIG. 3(B) shows a unit structure of the frame 29 corresponding to leads necessary for one chip which is defined by broken line 41, but the illustration of the leads in the right side of the chip is dispensed with in the figure. The unit structure repeatedly appears along the frame between the upper and lower rails of the frame as shown in FIG. 3(A). One frame contains 5 to 25 unit structures, e.g. 12 units. A number of the jigs 44 are integrally assembled in order to support 10 to 50 frames, e.g. 10 therebetween as shown in FIG. 3 (C). In this figure, the frames are supported in grooves of the jigs 44. Alternatively, the frames can be suspended at holes 51 by pins (not shown) formed on the jigs.

Next, protective film coating process in accordance with the present invention will be explained. A number of lead frames are mounted on the assemblies 2 after completing the electrical connection between the chips and the associated leads. The assemblies are disposed in the deposition chamber at a constant interval through the loading-unloading chamber 7.

In advance of actual deposition, the external surfaces of the IC devices are cleaned. Particularly, suboxide films are removed from the surfaces. After evacuating the deposition chamber, Ar gas is leaked into the deposition chamber 1 at 0.01 to 1 Torr from the gas feeding system 5 through a nozzle 3. The Ar gas is then converted to its plasma state by inputting energy of 1 KW at 13.56 MHz in order to form glow discharge and carry out plasma cleaning for 10 to 30 minutes. By this cleaning, lower films coated on the surfaces of the lead frames are eliminated. Next, $NH_3$, $Si_2H_6$ and $N_2$ (carrier gas) are leaked through the nozzle 3 at 0.01 to 1 Torr into the deposition chamber 1 respectively from the introduction ports 15, 16 and 17 at appropriate pressures. The introduction molar ratio of $NH_3/Si_2H_6/N_2$ is 1/3/5. Positive column glow discharge takes place when high frequency energy is input to the pair of electrodes 11 and 14 at 1 KW and 1 to 500 MHz, e.g. 13.56 MHz. As a result, there is deposited silicon nitride coating on the chips, the leads and the connection therebetween. The thickness of the coating reaches to $1000 \pm 200$ angstroms by continuing the deposition for 10 minutes. The average deposition speed is about 3 angstrom/sec.

After completing the deposition, the assemblies are removed from the chamber and undergo moulding process. Each assembly is placed on a moulding apparatus as it is. An epoxy material (410A) is injected to an appropriate portion around each chip with suitable moulds and forms an external chip package. After removing the assembly from the moulding apparatus, the IC's are separated from the frames by cutting the ends of the leads. Each lead, which extends beyond the moulding structure, is then bent downwardly in order to form the legs of an "IC worm". The leads are cleaned by acid washing, followed by solder plating.

Figure 1:
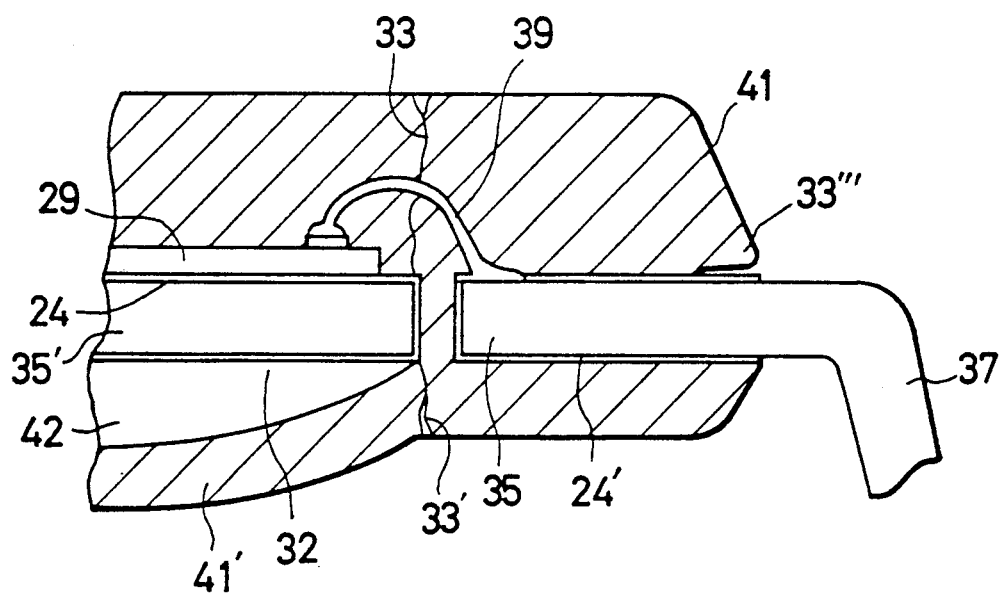
FIG. 1 is an explanatory cross section showing drawbacks of prior art devices.
Figure 4:
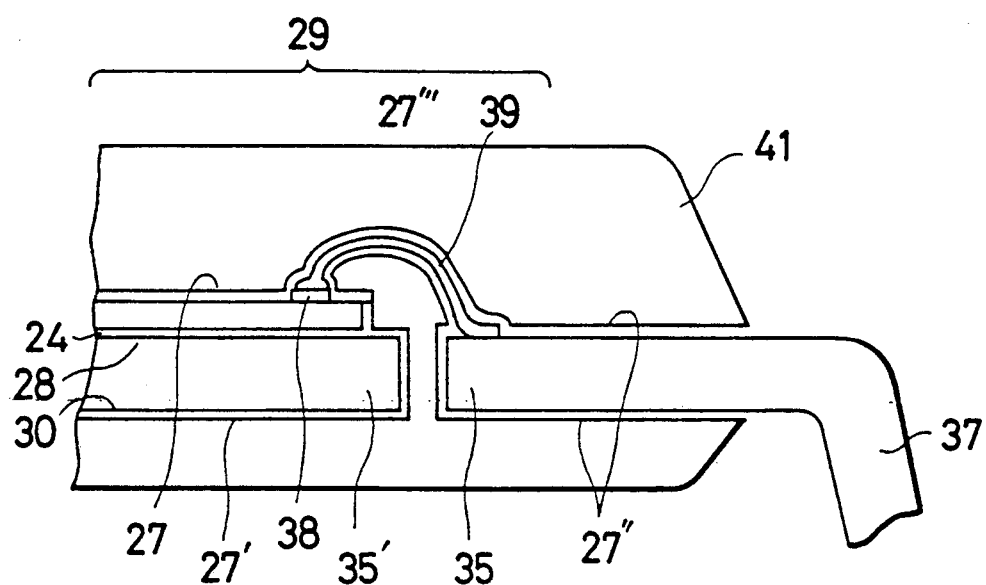
FIG. 4 is a partial cross section showing an IC device in accordance with the present invention.

The structure of the wiring connection in the moulding structure is illustrated in FIG. 4 in detail. As shown in the figure, the protective film of silicon nitride is covering the surfaces of the IC chip mounted on the base 35', contacts 38, the Au wiring 39 and the leads 37 made of a 42% nickle and 58% iron alloy. By virtue of the protective coating, the chip is protected from the attack of moisture which may invade the same through cracks 33 or gaps 33''' between the mould and the lead as shown in FIG. 1. Such a crack is particularly likely at the wiring 33 or at the corner edge 33'''. The mechanical connection between the lead frames and the nitride film is made sure since the surfaces of the lead frames are cleaned in advance of moulding. In accordance with experiments, the IR absorbing spectrum shows a peak at 864 cm$^{-1}$ which is indicative of Si—N bondings. The withstanding voltage level of the insulating coating was measured to be $8 \times 10^6$ V/cm. The resistivity of the coating is measured to be $2 \times 10^5$ ohm centimeter. The reflective index of the coating is measured to be 1.7 to 1.8. The protection ability of the coating was evaluated by effecting HF etching. The etching speed was 3 to 10 angstrom/sec, which was substantially small as compared to the figure, about 30 angstrom /sec, of conventional silicon nitride coatings 30 angstrome/sec. The thickness of such an excellent coating may be sufficiently 1000 angstroms (300 to 5000 angstroms in general).

IC devices manufactured in accordance with the present invention were kept in 5% NaCl solution at 95°C. for 20 hours. However, there was no applicable change after this testing. Also, IC devices manufactured in accordance with the present invention were subjected to PCT (pressure cooker test) under 10 atmospheres at 150° C. for 100 hours. As a result, there was found no defective after the test, and the fraction defective was decreased from 50-100 fits to 5-10 fits. One fit means $10^{-8}$.

After kept in an atmosphere of 85° C. and 85% (relative humidity) for 1000 hours, the IC devices were dipped in melting solder at 260° C. for 5 seconds in order to make electrical connection with circuits on a circuit board. However, no crack or swelling appeared. 500 samples prepared without plasma cleaning and silicon nitride film coating were subjected to this test. As a result, 80 samples became unacceptable due to defects as illustrated in FIG. 1. 500 samples given the plasma cleaning treatment without silicon nitride film coating were subjected to this test. As a result, 3 samples became unacceptable due to corrosion at the aluminum pads. Also, 500 samples given both the treatments of plasma cleaning and silicon nitride film coating were subjected to this test. As a result, no samples became unacceptable.

While several embodiments have been specifically described by way of examples, it is to be appreciated that the present invention is not limited to the particular examples described and that modifications and variations can be made without departing from the scope of the invention as defined by the appended claims. Some examples are as follows.

Diamond-like carbon, silicon oxide or other insulating material can be deposited to form the protective coating. Although the embodiment was IC chips, the present invention can be applied to other electric devices, such as resistors and capacitors. Also, the present invention is effective in cases utilizing other bonding methods such as flip chip bonding and solder bump bonding.

The plasma cleaning can be made more effective when the plasma is energized further by illumination of IR light rays having wavelengths of 10 to 15 micrometers or UV light rays having wavelengths no longer than 300 nanometers.

In the above embodiment, the lead frames are of the dual-in-line type. However, the present invention can be applied to other types of lead frames such as the flat pack type.

What is claimed is:

1. A method of manufacturing electronic devices comprising the steps of:
    making electrical connection between a semiconductor device and at least one associated lead;
    cleaning the surface of said semiconductor device and said lead by plasma treatment;
    enclosing said semiconductor device and said lead by an organic resin in order that a portion of said lead extends from the organic resin enclosure.

2. The method of claim 1 wherein said plasma treatment is performed by causing glow discharge in a plasma source gas.

3. The method of claim 2 wherein said plasma source gas is argon.

4. The method of claim 1 further comprising the step of coating said semiconductor device and said lead with an insulating material.

5. The method of claim 4 wherein said insulating material is coated in accordacne with the steps of:
    disposing said semiconductor device and said lead between a pair of electrodes in the reaction chamber of a plasma CVD apparatus;
    applying an alternating voltage between said electrodes in order to generate glow discharge;
    inputting a reactive gas into said reaction chamber;
    depositing said insulating material on the surface of said semiconductor device and said lead; and applying said organic resin around said semiconductor device in order to form a package enclosing said semiconductor device.

6. The method of claim 5 wherein the frequency of said alternating voltage is 1 to 500 MHz.

7. The method of claim 2 wherein a plurality of semiconductor devices are connected with a plurality of said leads which are integrally formed with a lead frame.

8. The method of claim 5 wherein said leads are separated from a lead frame after the formation of said package.

9. The method of claim 2 wherein said connection between said device proper and said lead is performed by wire bonding.

* * * * *